United States Patent [19]
Tsutsui et al.

[11] Patent Number: 6,016,278
[45] Date of Patent: Jan. 18, 2000

[54] FAILURE ANALYSIS METHOD AND DEVICE

[75] Inventors: Toshikazu Tsutsui, Tokyo; Masaaki Furuta, Hyogo, both of Japan

[73] Assignees: Mitsubishi Denki Kabushiki Kaisha, Tokyo; Ryoden Semiconductor System Engineering Corporation, Itami, both of Japan

[21] Appl. No.: 09/055,905

[22] Filed: Apr. 7, 1998

[30] Foreign Application Priority Data

Oct. 2, 1997 [JP] Japan .............................. P09-269712

[51] Int. Cl.[7] ...................................................... G11C 7/00
[52] U.S. Cl. ...................... 365/200; 364/468.17; 365/201
[58] Field of Search .................... 365/200, 201; 371/21.1, 21.6, 48; 364/468.17, 468.18

[56] References Cited

U.S. PATENT DOCUMENTS 5,844,850  12/1998  Tsutsui et al. ........................... 365/200

FOREIGN PATENT DOCUMENTS 6-275688  9/1994  Japan .

OTHER PUBLICATIONS

H. Nakawatase, et al., Expert System for Semiconductor Failure Analysis Using ARES™/DIAG, Toshiba Review, vol. 49, No. 8, 1994, pp. 563–566.

*Primary Examiner*—David Nelms
*Assistant Examiner*—David Lam
*Attorney, Agent, or Firm*—Oblon, Spivak, McClelland, Maier & Neustadt, P.C.

[57] ABSTRACT

A method comprises steps of: forming a FBM (step S1); generating a second failure map by compressing data of the FBM (step S2); recognizing a failure mode from the second failure map (step S3); selecting a specific failure mode (step S4); and analyzing the specific failure mode by using a part of the corresponding FBM (step S5). This makes a detail analysis possible while suppressing the number of processing data, and thereby achieves a failure analysis method and device improving accuracy and reliability in comparison result.

18 Claims, 15 Drawing Sheets

F I G. 3
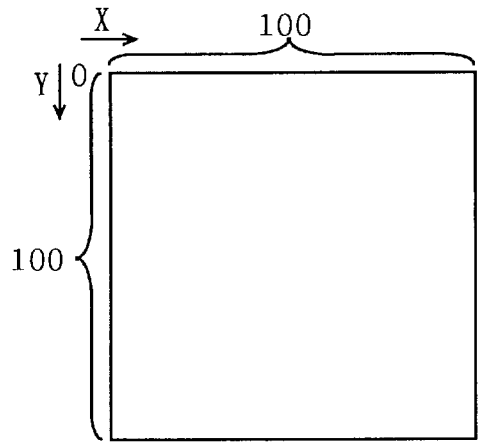
F I G. 4
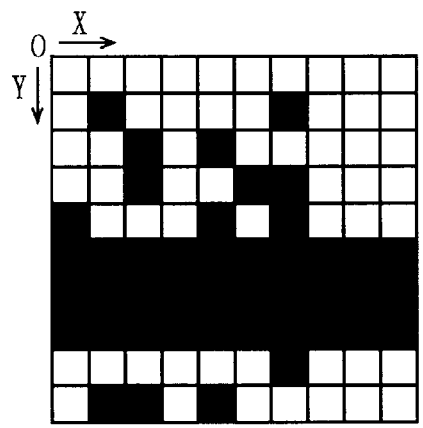
F I G. 5
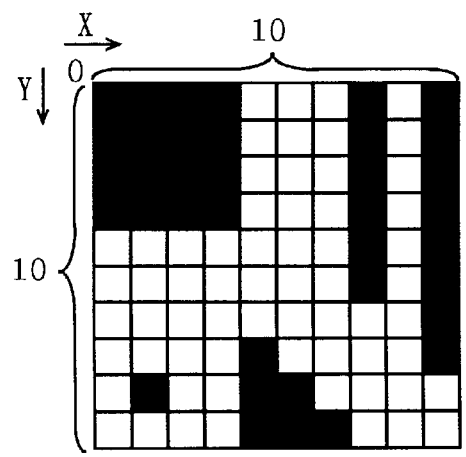

FLY1 FLY2 FLY3 FLY4

FIG. 23
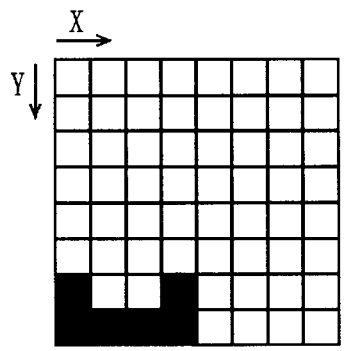
FIG. 24
```
       START
         ↓
GENERATE GRANDIENT VALUE ──S531
         ↓
DIVIDE BLOCKS INTO TWO LEVELS ──S5311
         ↓
DISTINGUISH BLOCKS BY COLORS ──S532
         ↓
RECOGNIZE FAILURE MODE ──S533
         ↓
        END
```
FIG. 25
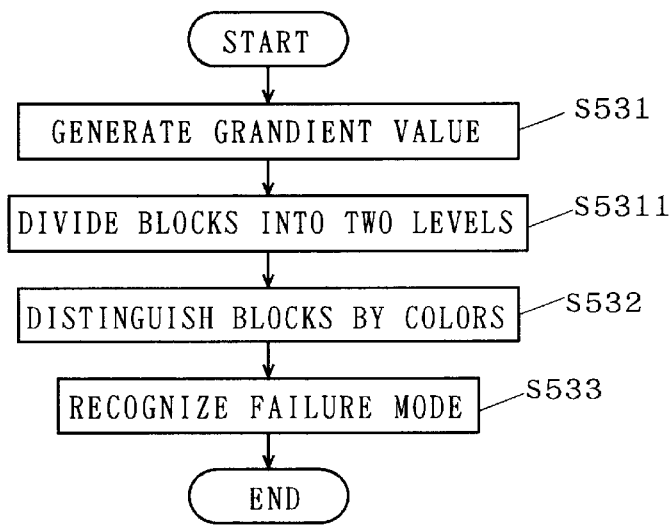

| No | FAILURE MODE | DEGENERATE RECOGNITION MODE | X-COORDINATES | Y-COORDINATES |
|---|---|---|---|---|
| 10 | 1.6K-BIT BLOCK FAILURE | —— | ------ | ------ |
| 11 | 100-BIT Y-LINE FAILURE | —— | ------ | ------ |
| 12 | 50-BIT Y-LINE FAILURE | —— | ------ | ------ |
| 13 | 100-BIT BLOCK FAILURE | —— | ------ | ------ |
| 19 | X-LINE FAILURE | 1.6K-BIT BLOCK FAILURE | ------ | ------ |
| 18 | BIT FAILURE | 1.6K-BIT BLOCK FAILURE | ------ | ------ |

FIG. 32
| No | FAILURE MODE | X-COORDINATES | Y-COORDINATES |
|---|---|---|---|
| 10 | 1.6K-BIT BLOCK FAILURE | ------ | ------ |
| 11 | 100-BIT Y-LINE FAILURE | ------ | ------ |
| 12 | 50-BIT Y-LINE FAILURE | ------ | ------ |
| 13 | 100-BIT BLOCL FAILURE | ------ | ------ |
| 14 | 300-BIT X-LINE FAILURE | ------ | ------ |
FIG. 33
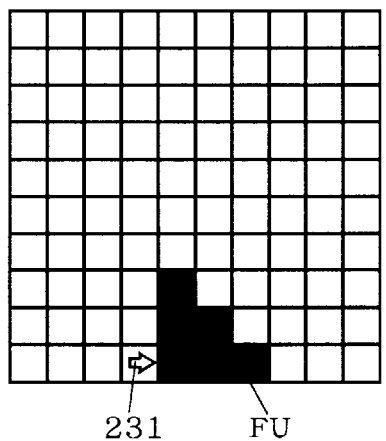
FIG. 34
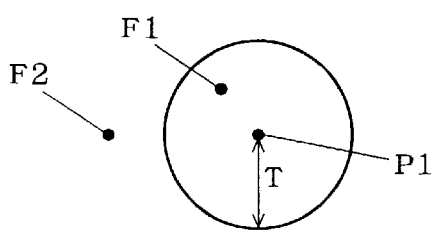

FAILURE ANALYSIS METHOD AND DEVICE

BACKGROUND OF THE INVENTION

1. Field of the Invention

The present invention is directed to a method and a device for analyzing a failure in a semiconductor wafer on which a plurality of chips having a plurality of memory cells are formed, and especially to a failure analysis method and device employing a fail bit map (hereinafter referred to as a FBM).

2. Background of the Invention

A well-known method for analyzing a failure in a semiconductor wafer, on which a plurality of semiconductor chips having a plurality of memory cells (generally arranged in a matrix of rows and columns) are formed, is the one employing a tester (known also as a LSI tester). In this method, electrical characteristics of all the memory cells in the semiconductor wafer are tested, and a failure detected therein is displayed on the FBM indicating a position of a defective memory cell (bit), in a space defined by coordinates including X-coordinates extending along a line direction and Y-coordinates extending along a column direction. This FBM is used to infer the cause of failure. A defective bit is called a failure bit.

However, the use of the FBM gives only a position of failure and information as to an electrical abnormal phenomenon, that is, a failure phenomenon, for example, on where and what (such as leak, open, and short) occurs. Namely, the cause of failure is not directly indicated. Thus, only the use of the FBM is not enough to infer the cause of failure in the field of manufacture or inspection, so that it is necessary to define the cause responsible for the failure phenomenon in a manufacturing process.

One of the well-known methods proposed on the basis of this idea is disclosed in the Japan Patent Laid-Open Gazette No. P06-275688A. In this method, a defect inspection system is used to obtain a physical inspection result, such as a dust particle or defect on a surface of the semiconductor wafer (hereinafter generally referred to as a "defect" throughout this specification, which is likely to be the cause of failure), for each step of a manufacturing line including a plurality of steps. Simultaneously, electrical characteristics of each memory cell in the semiconductor wafer manufactured through the manufacturing line are tested by a tester. Then, the FBM obtained from this test result and the physical inspection result of the position of a defect for each step are compared to infer which step of the manufacturing process generates a defect to be the cause of failure.

The above comparison between the FBM and the inspection result is made by retrieving a defect existing within a predetermined tolerable range whose center is each failure belonging to the FBM, from the defects obtained for each step by the defect inspection system. If the tolerable range is an appropriate size, a defect existing therein is assumed to be the cause of failure. With respect to each failure of the FBM, as the position of the failure in the FBM is closer to the position of the defect obtained by the defect inspection system, the possibility of the defect being the cause of failure is getting larger.

FIG. 3 shows the FBM when a memory cell array to be analyzed in the semiconductor wafer consists of, for example, 100×100 memory cells, and FIG. 4 is a detail view showing the vicinity of an origin 0 of the FBM shown in FIG. 3. The black portion of FIG. 4 indicates a failure bit. Since data of the FBM shown in FIG. 3 forms a considerable number, the FBM in which data is compressed is used for a conventional analysis. FIG. 5 shows the FBM after compressing the FBM of FIG. 3. In FIG. 5, the FBM of FIG. 3 is divided into blocks of 10×10 bits in X and Y directions, respectively. A block including a failure bit is called a failure block, indicated by the black portion of FIG. 5.

However, when a plurality of failure blocks are clustered like in the vicinity of the origin 0 of FIG. 5, it is impossible to determine correct coordinates of a defect to be the cause of failure. This results in low reliability of the comparison between the failure block and the defect.

SUMMARY OF THE INVENTION

A first aspect of the present invention is directed to a failure analysis method comprising the steps of: (a) generating a first failure map indicating a position of a failure bit in a semiconductor device; (b) generating a second failure map indicating a position of a failure block in the first failure map by dividing the first failure map into a plurality of blocks; (c) selecting an aggregate consisting of at least one of the blocks from the second failure map; and (d) analyzing the semiconductor device by using an area corresponding to the aggregate in the first failure map.

Preferably, according to a second aspect of the present invention, in the failure analysis method according to the first aspect, a plurality of failure modes are previously set depending on conditions including values obtained on the basis of a size or configuration of the aggregate and the number of failure bits included in the aggregate; and at least one of the plurality of failure modes is previously set as a select failure mode. The failure analysis method further comprises the step of: (e) recognizing the aggregate falling under each of the plurality of failure modes from the second failure map, wherein the aggregate of the step (c) falls under the select failure mode.

Preferably, according to a third aspect of the present invention, in the failure analysis method according to the second aspect, in the step (d), the aggregate falling under each of the plurality of failure modes is recognized from the area.

Preferably, according to a fourth aspect of the present invention, in the failure analysis method according to the third aspect, the plurality of failure modes includes a failure mode used in the steps (e) and (d).

Preferably, according to a fifth aspect of the present invention, in the failure analysis method according to the fourth aspect, in the step (d), the plurality of failure modes are recognized in a predetermined order of priority.

Preferably, according to a sixth aspect of the present invention, in the failure analysis method according to the fourth aspect, a failure mode used in the step (d) is obtained by deleting a predetermined failure mode from a plurality of failure modes used in the step (e).

Preferably, according to a seventh aspect of the present invention, in the failure analysis method according to the first aspect, the step (d) further comprises the step of dividing the area into a plurality of blocks and generating a third failure map indicating a gradient value obtained on the basis of the number of failure bits included in each of the plurality of blocks.

Preferably, according to an eighth aspect of the present invention, in the failure analysis method according to the seventh aspect, in the step (d), each block in the third failure map is displayed in, for example, pattern or color depending on the gradient value of the block.

Preferably, according to a ninth aspect of the present invention, in the failure analysis according to the seventh aspect, there are two kinds of gradient values in the step (d).

Preferably, according to a tenth aspect of the present invention, in the failure analysis method according to the ninth aspect, a plurality of failure modes are previously set depending on conditions including values obtained on the basis of a size or configuration of the aggregate and the number of failure bits included in the aggregate; and at least one of the plurality of failure modes is previously set as a select failure mode. The failure analysis method further comprising the step of: (e) recognizing the aggregate falling under each of the plurality of failure modes from the second failure map, wherein the aggregate in the step (c) falls under the select failure mode; and in the step (d), the aggregate falling under each of the plurality of failure modes is recognized from the third failure map.

Preferably, according to an eleventh aspect of the present invention, in the failure analysis method according to the second aspect, in the step (d), a failure mode of the aggregate corresponding to the area is managed.

Preferably, according to a twelfth aspect of the present invention, in the failure analysis method according to the third aspect, the failure analysis method further comprises the steps of: (f) managing a result recognized at the step (e) in a first data base; and (g) managing a result recognized at the step (d) in a second data base.

Preferably, according to a thirteenth aspect of the present invention, the failure analysis method according to the third aspect further comprises the step of: (h) managing both results recognized at the steps (e) and (d) in the same data base.

Preferably, according to a fourteenth aspect of the present invention, the failure analysis method according to the second aspect further comprises the steps of: (f) managing a result recognized at the step (e) in a data base; and (g) managing the recognized result of the failure block inputted from outside in the data base.

Preferably, according to a fifteenth aspect of the present invention, in the failure analysis method according to the fourteenth aspect, in the step (g), the second failure map is displayed at a display device, and the recognized result is inputted by a pointing device.

Preferably, according to a sixteenth aspect of the present invention, in the failure analysis method according to the first aspect, in the step (d), coordinates of a defect detected by a defect inspection system and coordinates of a failure bit in the area are compared to detect a failure bit existing within a range previously determined on the basis of the coordinates of the defect.

Preferably, according to a seventeenth aspect of the present invention, in the failure analysis method according to the first aspect, in the step (d), coordinates of a defect detected by a defect inspection system and coordinates of a failure bit in the area are compared to detect a defect existing within a range previously determined on the basis of coordinates of the failure bit.

An eighteenth aspect of the present invention is directed to a failure analysis device comprising: a first failure map generating portion for generating a first failure map indicating a position of a failure bit in a semiconductor device; a second failure map generating portion for generating a second failure map indicating a position of a failure block in the first failure map by dividing the first failure map into a plurality of blocks; a selecting portion for selecting an aggregate consisting of at least one block from the second failure map; and an analysis portion for analyzing a semiconductor device by using an area corresponding to the aggregate in the first failure map.

According to the first aspect of the present invention, not the first failure map itself but an area in the first failure map corresponding to a select aggregate consisting of at least one block is used for an analysis of the semiconductor device. This makes a detail analysis possible while suppressing the number of data of the aggregate.

According to the second aspect of the present invention, a detail analysis of an aggregate falling under a failure mode necessary to analyze in detail becomes possible by setting the failure mode, such as the block failure, as a select failure mode.

According to the third aspect of the present invention, since recognized in the same way as the step (e), a failure mode in the area can be recognized by employing the program used in the step (e).

According to the fourth aspect of the present invention, a failure mode in the second failure map and that in the area can be separately recognized.

According to the fifth aspect of the present invention, a failure mode is recognized in order of priority. This prevents a double recognition of the same aggregate.

According to the sixth aspect of the present invention, only a failure mode to be a direct cause of failure can be recognized, since a failure mode not to be a direct cause of failure, such as a bit failure, or a mode difficult to specify the cause of failure, such as a block failure, is deleted.

According to the seventh aspect of the present invention, the generation of the third failure map reduces the number of data and shortens the processing time for an area.

According to the eighth aspect of the present invention, the blocks are displayed in pattern or color depending on the respective gradient values. Thus, an operator can quickly and easily analyze the cause of failure.

According to the ninth aspect of the present invention, a block including a lot of failure bits, for example, can be obviously found by the two kinds of gradient values.

According to the tenth aspect of the present invention, since recognized in the same way as the step (e), a failure mode in the area can be analyzed by employing the program used in the step (e).

According to the eleventh aspect of the present invention, a failure mode of an aggregate corresponding to the area is managed. Thus, the relationship between the area and the failure mode of the aggregate, for example, can be clearly defined.

According to the twelfth aspect of the present invention, the result recognized at the step (e) and the result recognized at the step (d) are managed by the different data bases. This reduces the processing load in data management and increases the processing speed.

According to the thirteenth aspect of the present invention, the recognized result can be easily managed by managing both of the results recognized at the steps (e) and (d) in the same data base.

According to the fourteenth aspect of the present invention, as to a failure block which has not been recognized at the step (c), for example, an accurate analysis result can be grasped by managing the recognized result inputted from outside.

According to the fifteenth aspect of the present invention, the use of the pointing device increases the speed at inputting a failure block.

According to the sixteenth aspect of the present invention, accurate coordinates of a defect to be the cause of failure can be defined by comparing the coordinates of the defect with coordinates of a failure bit in the area. This increases reliability of comparison between the defect and the failure block. Further, if the number of failure bits becomes smaller than the number of defects, comparison made for one defect is reduced in number and the processing speed is increased.

According to the seventeenth aspect of the present invention, accurate coordinates of a defect to be the cause of failure can be defined by comparing the coordinates of the defect with coordinates of a failure bit in the area. This increases reliability of comparison between the defect and the failure block. Further, if the number of failure bits becomes smaller than that of the defects, comparison made for one defect is reduced in number and the processing speed is increased.

According to the eighteenth aspect of the present invention, the analysis portion employs not the first failure map itself generated by the first failure map generating portion but an area in the first failure map corresponding to an aggregate which is selected by a selection portion and formed of at least one block, for an analysis of the semiconductor device. This makes a detail analysis possible while suppressing the number of data of the aggregate.

The object of the present invention is to obtain the failure analysis method and device improving accuracy and reliability of comparison result while obtaining coordinates of a defect with high accuracy.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 shows an example of a FBM.

FIG. 4 is a detail view in the vicinity of an origin 0 of the FBM shown in FIG. 3.

FIG. 5 shows an example of a second failure map.

FIG. 23 is a display example of the third failure map in accordance with a sixth preferred embodiment of the present invention.

FIG. 24 is a flow chart for an explanation of a seventh preferred embodiment of the present invention.

FIGS. 25 and 26 are display examples of an analysis result in accordance with an eighth preferred embodiment of the present invention.

FIG. 27 is a structural view of the failure analysis device in accordance with a ninth preferred embodiment of the present invention.

FIG. 32 is a display example of a recognition result in accordance with the eleventh preferred embodiment of the present invention.

FIG. 33 is a diagram for an explanation of a twelfth preferred embodiment of the present invention.

FIG. 34 is a schematic view showing a comparison between an extract area and a defect in accordance with a thirteenth preferred embodiment of the present invention.

DESCRIPTION OF THE PREFERRED EMBODIMENTS

1. First Preferred Embodiment

Figure 1:
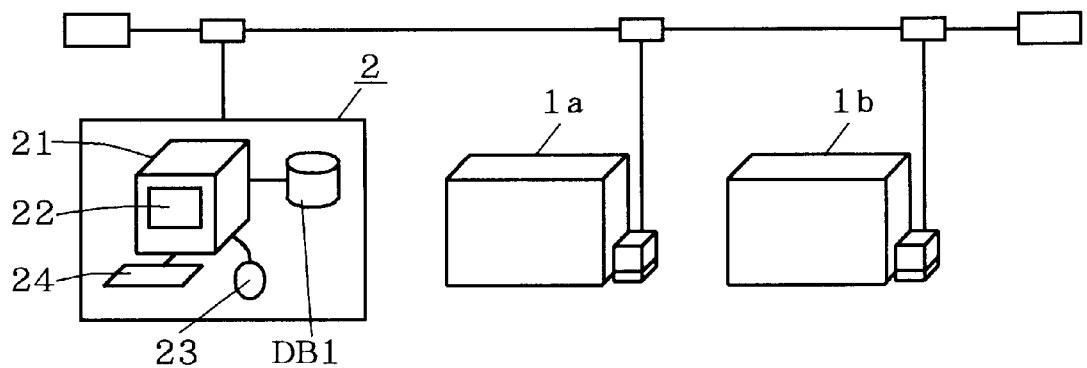
FIG. 1 is a structural view of a failure analysis device according to the present invention.

FIG. 1 is a structural view of a failure analysis device according to the present invention. In FIG. 1, the reference character 1a is a LSI tester for testing electrical characteristics of all memory cells in a semiconductor device, such as an integrated circuit, formed on a semiconductor wafer; 1b is a defect inspection system for detecting a defect on a surface of the semiconductor wafer and a position thereof; 2 is an EMS (Engineering Work Station) for data analysis which receives a test result outputted from the LSI tester 1a and an inspection result outputted from the defect inspection system 1b, and analyzes the semiconductor device as to failure on the basis of these results. The EWS for data analysis 2 comprises a body 21; a display device 22 such as a display; a mouse 23; a key board 24; and a data base DB1.

Figure 2:
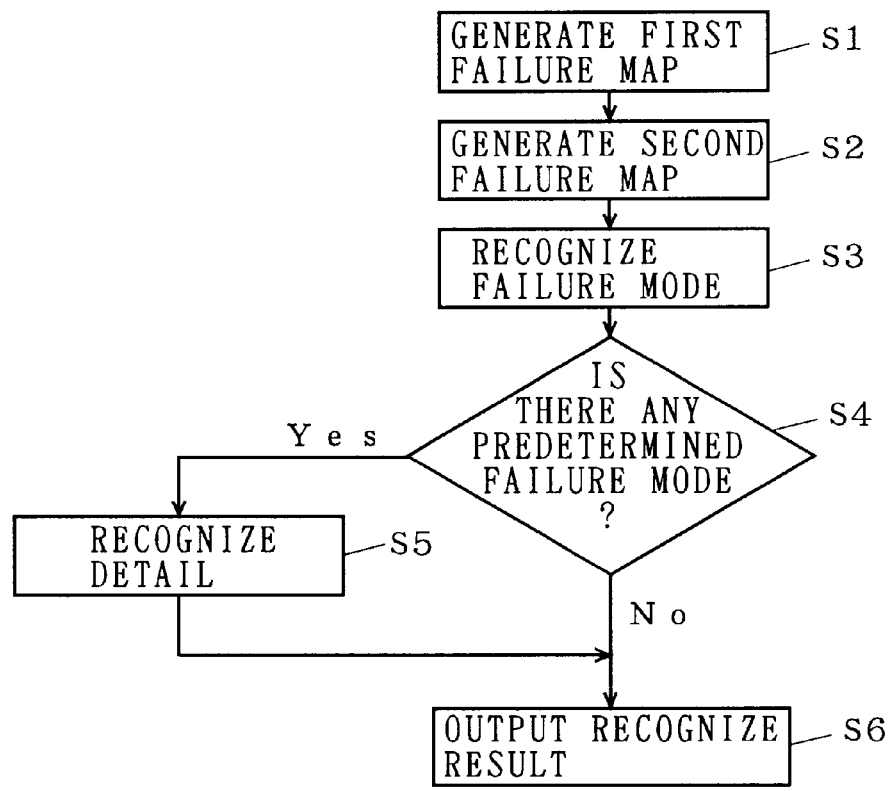
FIG. 2 is a flow chart illustrating a failure analysis method in accordance with a first preferred embodiment of the present invention.

FIG. 2 is a flow chart illustrating a failure analysis method according to a first preferred embodiment of the present invention. A program including an algorithm of the failure analysis method shown in FIG. 2 is provided with the EWS for data analysis 2 which in turn obtains a function portion for performing each of steps S1 through S6 of FIG. 2. The step S1 is a first failure map generating portion; S2 is a second failure map generating portion; S3 is a failure mode recognition analysis portion; S4 is a selecting portion; S5 is a detail recognition analysis portion; and S6 is an output portion.

First, the body 21 of the EWS for data analysis generates data shown by a FBM indicating a position of a failure memory cell (bit) on the basis of a test result (step S1). The FBM generated at the step S1 is called a first failure map.

FIG. 3 shows the FBM, for example, when a memory cell array to be analyzed in the semiconductor wafer consists of 100×100 memory cells, and FIG. 4 is a detail view in the vicinity of an origin 0 of the FBM shown in FIG. 3. The black portion of FIG. 4 indicates the failure bit. We will give the following description with this example.

The first failure map generated at the step S1 is divided into blocks of m1×n1 bits in the X and Y directions, respectively, to generate a second failure map indicating a position of a block including a failure bit (step S2).

FIG. 5 shows an example of the second failure map when the first failure map of FIG. 3 is divided into blocks of 10×10 bits in the X and Y directions, respectively. The black portion of FIG. 5 indicates the failure block. The body 21 of the EWS for data analysis calculates and manages a failure rate of each block. The failure rate is a ratio of failure in an area; for example, the failure rate in a block is obtained by dividing the total number of bits in the block by the total number of failure bits in the block.

An element constituting a failure map, such as a bit constituting the first failure map and a block constituting the second failure map, is generally called a component, and a defective component is called a failure component.

The first failure map of FIG. 3 contains 10,000 components; and the second failure map of FIG. 5 contains 100 components, in total. Thus, the conversion from the first failure map into the second failure map reduces the number of data. Such a data compression is called degeneracy.

Then, the body 21 of the EWS for data analysis recognizes an aggregate of components falling under a predetermined failure mode from the second failure map, and classifies this recognition result according to its failure mode (step S3).

The detail description of the step S3 will be given with reference to FIGS. 5 through 14. FIGS. 10 through 13 show aggregates recognized and classified from the second failure map of FIG. 5.

Figure 10:
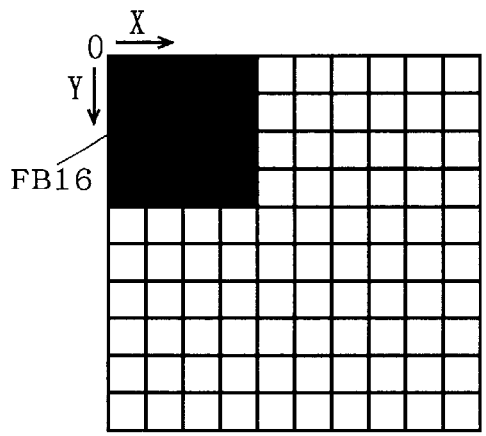
Figure 11:
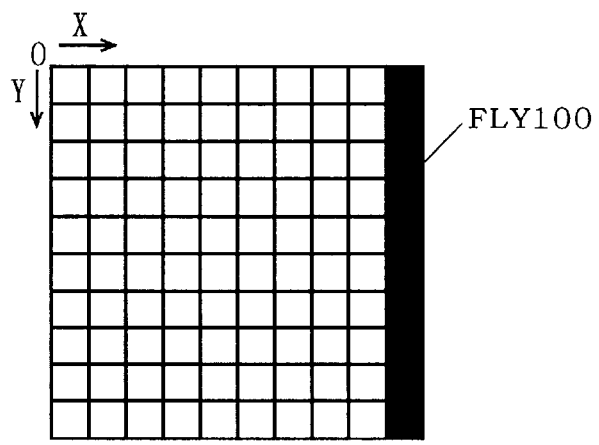
Figure 12:
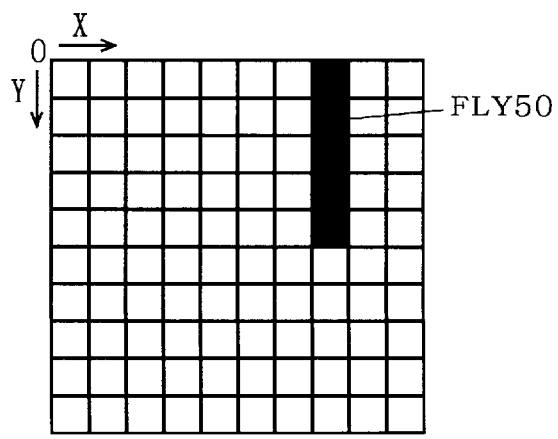
Figure 13:
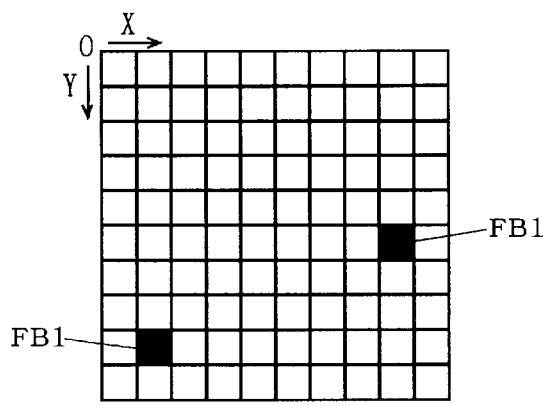
Figure 14:
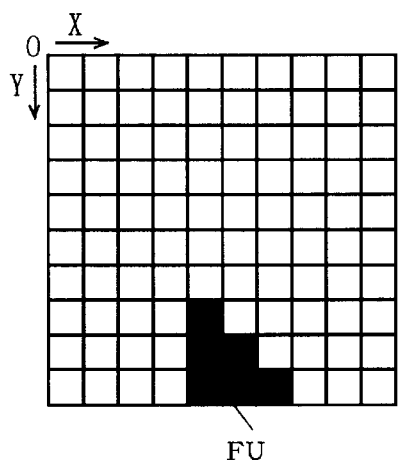

FIG. 10 shows an aggregate FB16 of components falling under a failure mode of a 1.6 k-bit block failure. FIG. 11 shows an aggregate FLY100 of components falling under a failure mode of a 100-bit Y-line failure. FIG. 12 shows an aggregate FLY50 of components falling under a failure mode of a 50-bit Y-line failure. FIG. 13 shows an aggregate FB1 of components falling under a failure mode of a bit failure. FIG. 14 shows an aggregate FU of the remaining components which do not fall under any failure mode.

An aggregate which is a group of a plurality of components extending in the X and Y directions, respectively, corresponds to the block failure; an aggregate consisting of a plurality of components arranged in a straight line extending in the X or Y direction corresponds to the line failure; and an aggregate consists of one independent component corresponds to the bit failure. The configuration of such an aggregate is generally called a failure configuration.

A method for recognizing a failure mode works as follows. The failure mode is defined by a recognition rule which specifies conditions including values obtained on the basis of a size or configuration of an aggregate and the number of failure bits included in the aggregate. The following are examples of the recognition rule.

The recognition rule of the 1.6k-bit block failure is {size=4×4; accepted rate=80%}; that of the 100-bit Y-line failure is {size=1×10; accepted rate=70%}; that of the 50-bit Y-line failure is {size=1×5; accepted rate=80%}; that of the bit failure is {size=1×5; accepted rate=100%}; and an unknown failure has no condition.

The above "size" indicates the size or configuration of an aggregate (components in the X direction×components in the Y direction), and the "accepted rate" indicates the failure rate, that is, the value obtained on the basis of the number of failure bits.

Figure 6:
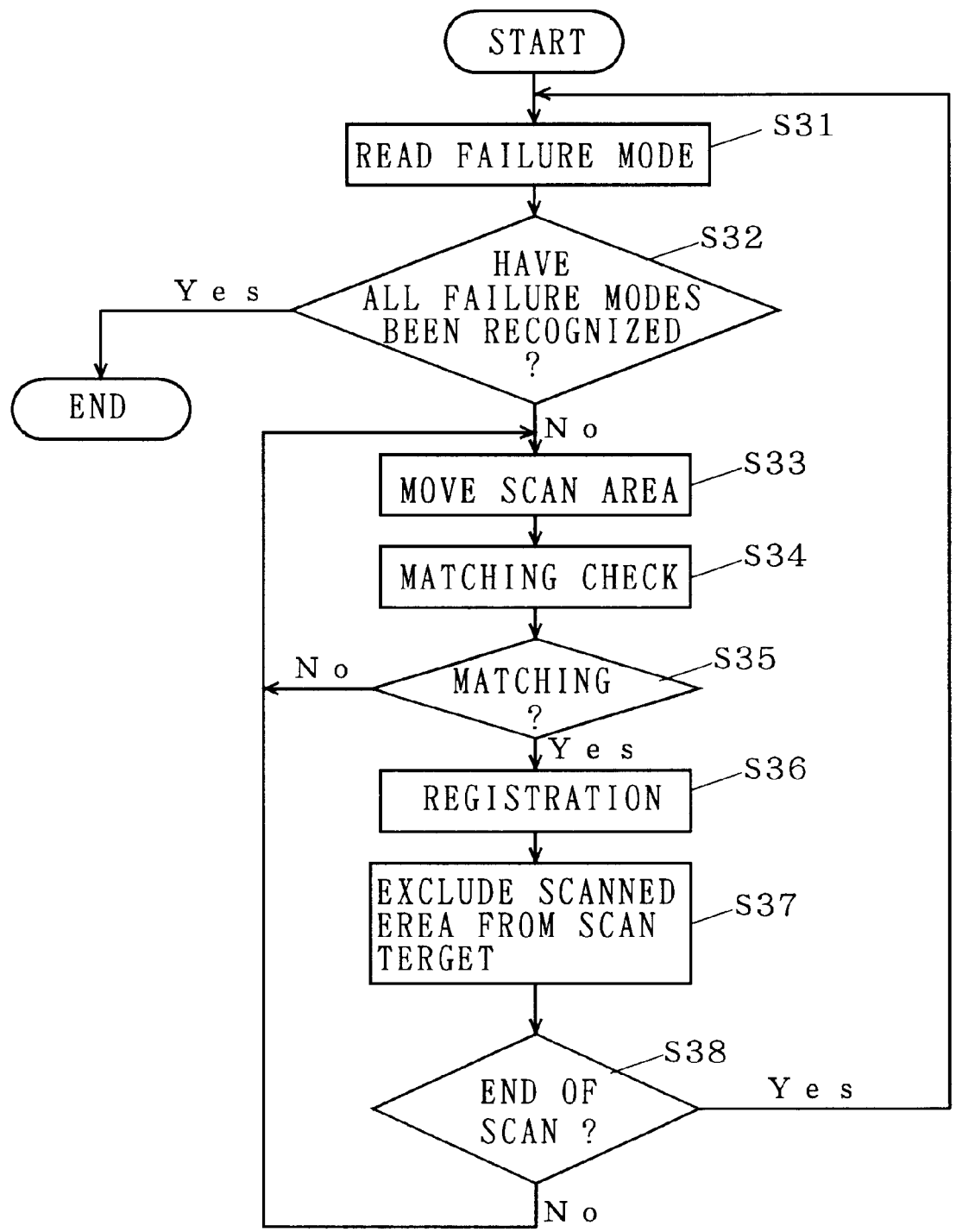
FIG. 6 is a flow chart illustrating an algorithm of a method for recognizing a failure mode in accordance with the first preferred embodiment of the present invention.
Figure 7:
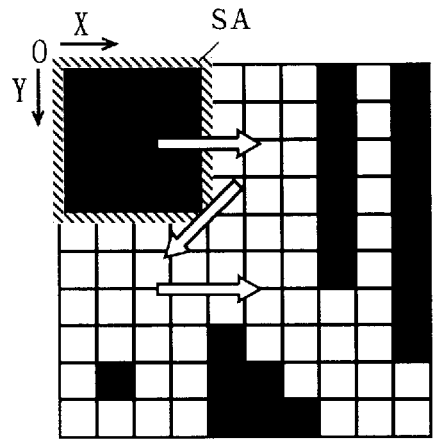
FIGS. 7 through 14 are diagrams for an explanation of the method for recognizing the failure mode.
Figure 8:
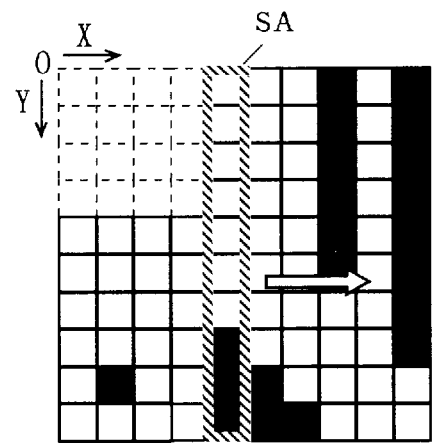
Figure 9:
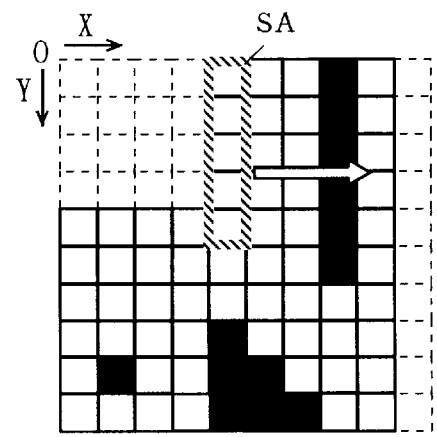

FIG. 6 is a flow chart illustrating an algorithm of the method for recognizing a failure mode. The body 21 of the EWS for data analysis reads the first recognition rule (step S31). Steps S33 through S38 are carried out as follows. While a scan area SA moves toward a component to be a scan target as shown in FIG. 7 (step S33), whether a block in this scan area matches the recognition rule is checked (step S34). In this matching, the failure rate in the scan area and the "accepted rate" are compared, and if the failure rate in the scan area is equal to or larger than the "accepted rate", an aggregate of components in the scan area falls under a failure mode of the first recognition rule (step S35).

The aggregate of components falling under the failure mode is registered in the data base DB1 along with its coordinates and the name of the failure mode (step S37). After the scan area moves all areas to be scanned, the process returns to the step S31 (step S38).

In this way, the steps S31 through S38 are repeated. When there is no more recognition rule to be read at the step S31, the step S3 is terminated (step S32).

Further, at the step S37, an aggregate of components which have already been recognized is excluded from the scan target. For example, the scan target after reading the recognition rule of the 100-bit Y-line failure is an area except a part indicated by broken lines in FIG. 8; and the scan target after reading the recognition rule of the 50-bit Y-line failure is an area except a part indicated by broken lines in FIG. 9. Since an aggregate of components falling under the failure mode which has already been recognized is excluded from the scan target, the same aggregate would not be recognized again. For instance, though FIG. 5 includes two aggregates of failure components arranged in the Y direction, one of them is recognized as a part of the 100-bit Y-line failure shown in FIG. 11, and the other is recognized as the 50-bit Y-line failure shown in FIG. 12. In this way, the recognition of a plurality of failure modes is made in a predetermined order of priority.

In the above description, the failure mode of a larger failure configuration receives priority for recognition by arranging the recognition rules in descending order of the failure configuration. In order to give priority to a failure mode of a smaller failure configuration, the failure modes are arranged in ascending order of the failure configuration. Further, in order to give priority of recognition to the failure mode of the bit failure, the failure mode of the bit failure would be arranged at the head of failure modes; and in order to give priority of recognition to the failure mode of the line failure, the failure mode of the line failure would be arranged at the head of failure modes. When the failure mode of the bit failure is arranged at the head of failure modes, for example, it becomes possible to recognize a bit failure included in a block failure, which would be impossible when the failure mode of the block failure is arranged at the head of failure modes.

The comparison between FIGS. 5 and 11 shows that two components out of the aggregate FLY100 are not the failure components. This happens because the aggregate falling under the failure mode is recognized by the failure rate.

Further, for the recognition rule of an "unknown" failure, the remaining failure components in the scan target are recognized as an "unknown" failure mode.

An operator previously sets a failure mode for which a detail analysis is necessary as a select failure mode at the body 21 of the EWS for data analysis. The body 21 of the EWS for data analysis selects an aggregate falling under the select failure mode as a select aggregate (step S4). When the select failure mode is the 100-bit Y-line failure, for example, the aggregate FLY100 of FIG. 11 becomes the select aggregate.

The body 21 of the EWS for data analysis extracts an area corresponding to the select aggregate as an extract area from the first failure map. For example, the extract area corresponding to the aggregate FLY100 is the area formed of the X-coordinates from 89 through 99 and the Y-coordinates from 0 through 99 shown in FIG. 3. Then, for the select failure mode, the body 21 of the EWS for data analysis employs this extract area for failure analysis of the semiconductor device (step S5).

Further, for failure modes except the select failure mode, the body 21 of the EWS for data analysis uses the second failure map at the step S3.

Then, the body 21 of the EWS for data analysis displays the processing result of the steps S4 and S5 at the display device 22 (step S6).

Figure 15:
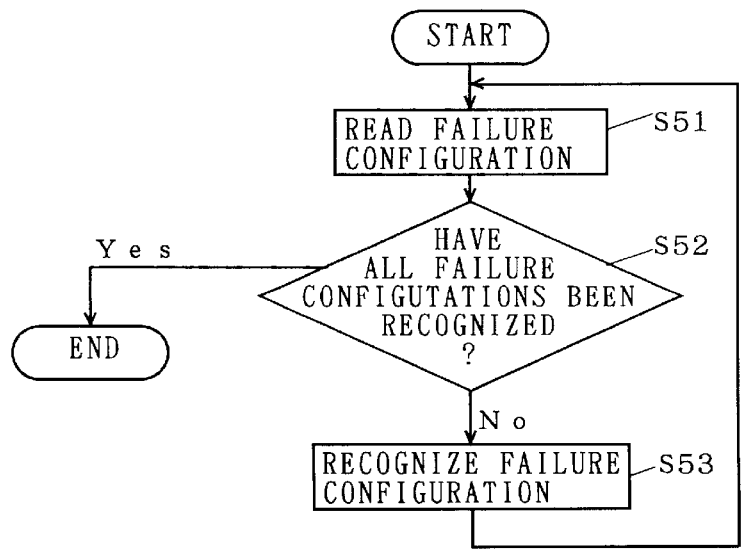
FIG. 15 is a flow chart illustrating a method for recognizing a failure configuration.

At the step S5 of the first preferred embodiment, the failure configuration is recognized by the conventional method. In this method, a failure configuration is read (step S51 of FIG. 15), and a failure component corresponding to the failure configuration which is read from the extract area is recognized (step S53). The process is terminated after all kinds of the failure configuration are read (step S51).

Figure 16:
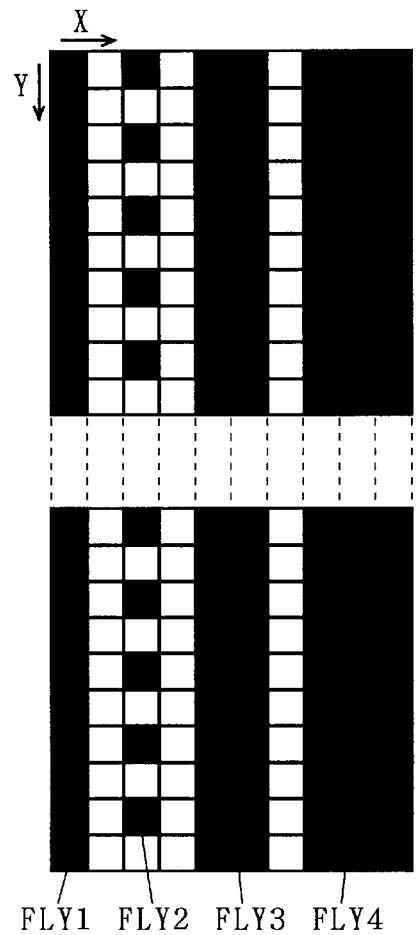
FIG. 16 shows an example of the failure configuration.

For example, when the extract area corresponding to the aggregate FLY100 includes the failure components (failure bits in this case) as shown in FIG. 16, a one-line line failure FLY1, a broken-line line failure FLY2, a two-line line failure FLY3, and a three-line line failure FLY4 are recognized as the failure configuration. Though recognized only as a one-line line failure from the second failure map, the aggregate FLY100 can be recognized as a line failure consisting of a plurality of line failures from the extract area. Thus, with the use of the extract area, the body 21 of the EWS for data analysis can recognize the select failure mode in detail.

The effect of the first preferred embodiment is as follows. If only the first failure map is used for analysis without using the second failure map, a detail analysis is possible, but the number of data to be analyzed is increased. On the other hand, if the second failure map is used for analysis, the number of data is reduced, but a detail analysis becomes difficult. Thus, the extract area is employed for a failure mode for which a detail analysis is necessary, which makes a detail analysis possible while suppressing the number of data to be analyzed.

2. Second Preferred Embodiment

At the step S5 of the first preferred embodiment, the failure configuration of, for example, the line failure is recognized from the extract area. At the step S5 of a second preferred embodiment, a failure mode is recognized from the extract area using an algorithm similar to that of the step S3. The other steps of the second preferred embodiment is the same with those of the first preferred embodiment.

The method for recognizing a failure mode, used at the step S5, is the same one as described in the first preferred embodiment. Here, the failure mode used in the step S5 may be different from the failure mode used in the step S3.

The following are the recognition rules corresponding to failure modes used in the step S5.

The recognition rules of the bit failure are {size=1×1; accepted rate=100%}, {size=1×2; accepted rate=100%}, and {size=2×1; accepted rate=100%}.

Figure 17:
FIG. 17 shows an example of an extract area in accordance with the first preferred embodiment of the present invention.
Figure 18:
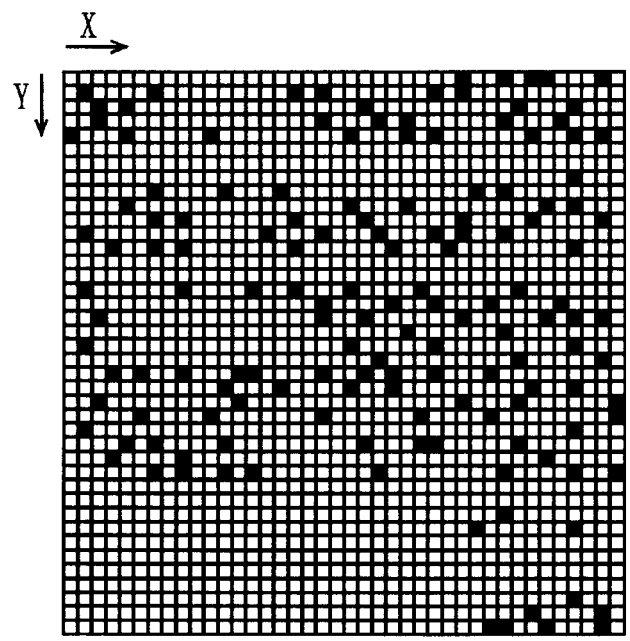
FIG. 18 shows an example of the failure mode in accordance with a second preferred embodiment of the present invention.

Through the step S5 of the second preferred embodiment, a failure mode existing within the extract area is recognized. FIG. 18 shows an aggregate falling under the failure mode of the bit failure recognized and classified from the extract area of FIG. 17.

When the accepted rate is 100%, an aggregate consisting only of a failure component larger than the search area is excluded from the scan target. This allows a recognition of an independent bit failure.

The effect of the second preferred embodiment is that the program can be simplified by employing the method for recognizing a failure mode, which is used to recognize a component from the second failure map at the step S3, as an algorithm to recognize a component from the extract area at the step S5.

3. Third Preferred Embodiment

At the step S5 of the first preferred embodiment, the failure configuration of, for example, the line failure is recognized from the extract area. At the step S5 of a third preferred embodiment, a failure mode is recognized from the extract area using a method similar to that of the step S3. The other steps of the third preferred embodiment are the same as those of the first preferred embodiment.

The method for recognizing a failure mode at the step S5 is the same one as described in the first preferred embodiment. Here, the failure mode used in the step S5 may be different from the failure mode used in the step S3.

The following is the recognition rule corresponding to a failure mode used in the step S5.

The recognition rule of the 40-bit line failure is {size=40×1; accepted rate=75%}.

Figure 19:
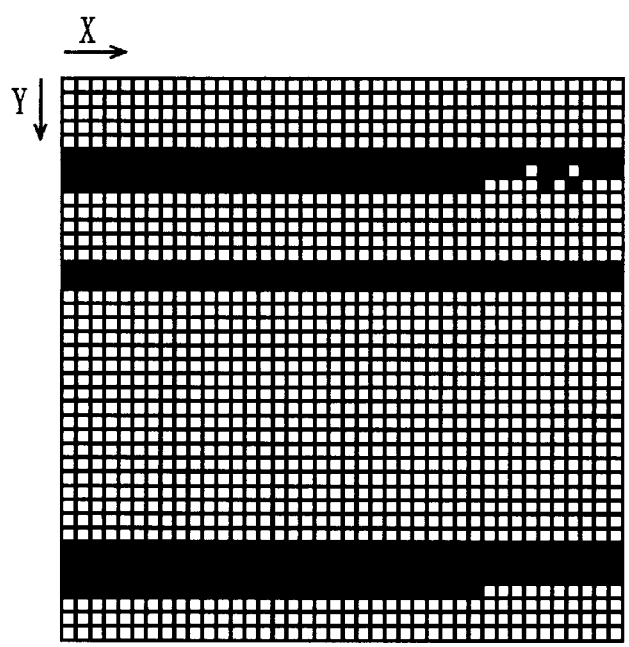
FIG. 19 shows an example of the failure mode in accordance with a third preferred embodiment of the present invention.

Through the step S5 of the third preferred embodiment, the failure mode existing within the extract area is recognized. FIG. 19 shows an aggregate falling under the failure mode corresponding to the line failure recognized and classified from the extract area of FIG. 17.

The effect of the third preferred embodiment is that the program can be simplified by employing the method for recognizing a failure mode, which is used to recognize a component from the second failure map at the step S3, as an algorithm to recognize a component from the extract area at the step S5.

Further, with regard to a failure mode in the recognition rule used in the step S5, a failure mode which cannot be a direct cause of failure is deleted from the failure modes in the recognition rule used in the step S3. Thus, only a failure mode to be a direct cause of failure can be recognized. For example, the failure mode in the recognition rule used in the step S5 is only the line failure since the bit failure and the block failure are deleted, so that only the line failure to be a direct cause of failure can be recognized.

4. Fourth Preferred Embodiment

At the step S5 of the first preferred embodiment, the figure configuration of, for example, the line failure is recognized from the extract area. At the step S5 of a fourth preferred embodiment, a third failure map is generated from the extract area. The other steps of the fourth preferred embodiment are the same as those of the first preferred embodiment.

The step S5 of the fourth preferred embodiment is as follows. First, the body 21 of the EWS for data analysis extracts an area corresponding to a select aggregate from the first failure map as an extract area which is then divided into blocks of m2×n2 bits in the X and Y directions, respectively. The body 21 of the EWS for data analysis further calculates a gradient value on the basis of the number of failure bits in each block, and generates the third failure map indicating the gradient value of each block.

Figure 20:
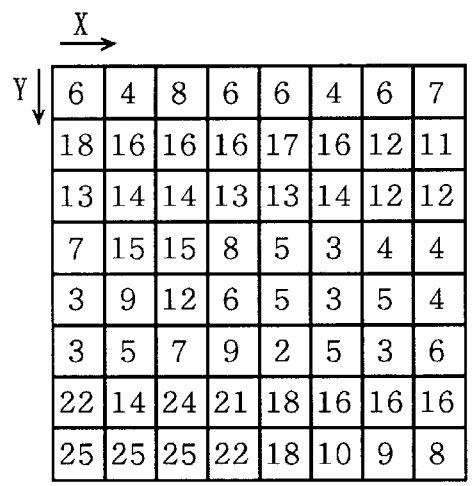
FIG. 20 shows an example of a third failure map in accordance with a fourth preferred embodiment of the present invention.

FIG. 20 shows an example of the third failure map. In FIG. 20, the extract area shown in FIG. 17 is divide into blocks of 5×5 bits in the X and Y directions, respectively. The number of each block in FIG. 20 indicates the gradient value. In this example, the gradient value is equivalent to the number of failure memory cells in the block. Thus, the block are divided into several levels (25 levels in FIG. 20) on the basis of the number of failure memory cells, and recognized by those levels.

The effect of the fourth preferred embodiment is that, since the number of data is reduced by converting the extract area into the third failure map, the processing time for the extract area can be reduced.

5. Fifth Preferred Embodiment

A fifth preferred embodiment is directed to a display of the third failure map generated in the fourth preferred embodiment.

Figure 21:
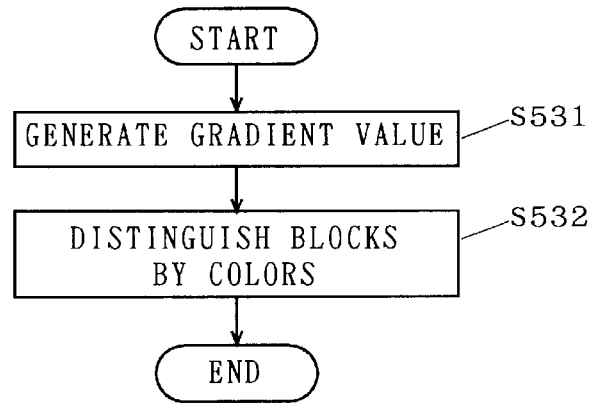
FIG. 21 is a flow chart for an explanation of a fifth preferred embodiment of the present invention.

FIG. 21 is a flow chart illustrating the detail of the step S5 of the fifth preferred embodiment. First, as described in the fourth preferred embodiment, the third failure map is generated (step S531 of FIG. 21). Then, the third failure map is displayed at the display device 22 in different color or pattern depending on the gradient values or the combination thereof so that the gradient value of each block can be visually distinguished (step S532).

Figure 22:
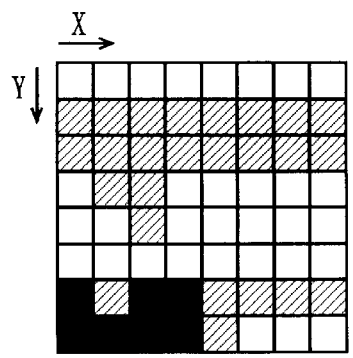
FIG. 22 is a display example of the third failure map in accordance with the fifth preferred embodiment of the present invention.

For example, the third failure map of FIG. 20 is displayed so that each block is distinguished by its color as shown in FIG. 22. In FIG. 22, the gradient values of the respective blocks are divided into three levels (depending on the number of failure memory cells: 0–10, 11–20, or 21–25) and displayed in different colors. The color of each block becomes thicker as the number of failure memory cells increases.

The effect of the fifth preferred embodiment is that, since the number of failure memory cells in each block is visually distinguished on display, an operator can quickly and easily analyze the cause of failure.

6. Sixth Preferred Embodiment

In a sixth preferred embodiment, the gradient values employed in the fourth or fifth preferred embodiment are divided into two levels.

FIG. 23 shows that the third failure map of the extract area shown in FIG. 17 is displayed in two different colors. The black block of FIG. 23 indicates a block which includes failure memory cells equal to or larger than a predetermined threshold value (21 in this case) in number, while the white block indicates a block which includes the failure memory cells less than the threshold value in number. Namely, there are two kinds of gradient values for the respective blocks in the third failure map, depending on whether the number of failure bits in each block is larger than a predetermined threshold value or not.

The effect of the sixth preferred embodiment is that the failure block can be obviously found by dividing the blocks into two levels on the basis of a predetermined threshold value.

7. Seventh Preferred Embodiment

In a seventh preferred embodiment, a failure mode is recognized from the third failure map divided into two levels in the sixth preferred embodiment, by using a method similar to that of the step S3. FIG. 24 is a flow chart illustrating the detail of the step S7 of the seventh preferred embodiment. A step S5311 of FIG. 24 is the process of dividing blocks into two levels as described in the sixth preferred embodiment; a step S533 is the process of recognizing a failure mode from the third failure map divided into two levels; and the steps S531 and S532 correspond to those of FIG. 21, respectively. The method for recognizing a failure mode, used in the step S533, is the same one as described in the first preferred embodiment. Here, the failure mode used in the step S533 may be different from the failure mode used in the step S3.

The effect of the seventh preferred embodiment is that the failure mode in the third failure map can be recognized by dividing the third failure map into two levels.

8. Eighth Preferred Embodiment

In an eighth preferred embodiment, an analysis result obtained through the use of the extract area at the step S5 of FIG. 2 are managed together with the name of a failure mode corresponding to the extract area, so that the name of the failure mode is added to the analysis result as an attribute information. The failure mode is recognized at the step S3.

When the extract area shown in FIG. 17 is used in the step S5, for example, the analysis result obtained by using this extract area is managed together with the 1.6 K-bit block failure recognized at the step S3.

Figures 26, 27:
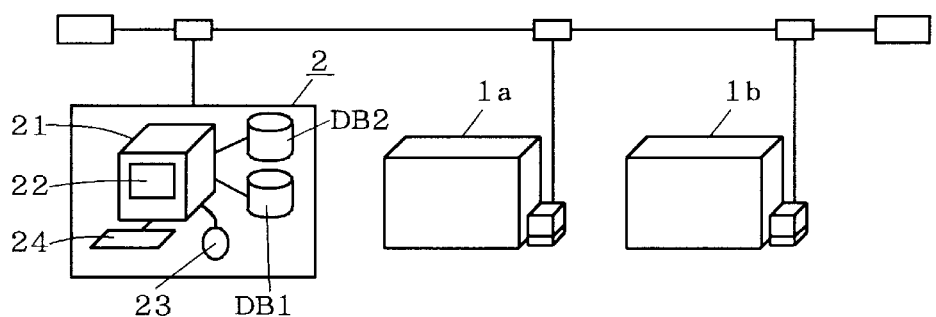

The effect of the eighth preferred embodiment is that a determination can be easily made which of the failure modes in the second failure map the extract area falls under, by managing the analysis result obtained through the use of the extract area together with the name of the failure mode recognized at the step S3. FIGS. 25 and 26 show display examples of the analysis result. The comparison between FIGS. 25 and 26 tells that whether the failure mode displayed in the filed of failure modes is the failure mode of the extract area or the failure mode of the second failure mode becomes clear by displaying the attribute information of data in the field of degenerate recognition modes.

9. Ninth Preferred Embodiment

FIG. 27 is a structural view showing the failure analysis device according to a ninth preferred embodiment of the present invention. This failure analysis device is made by adding a data base DB2 to the failure analysis device of FIG. 1.

Figure 28:
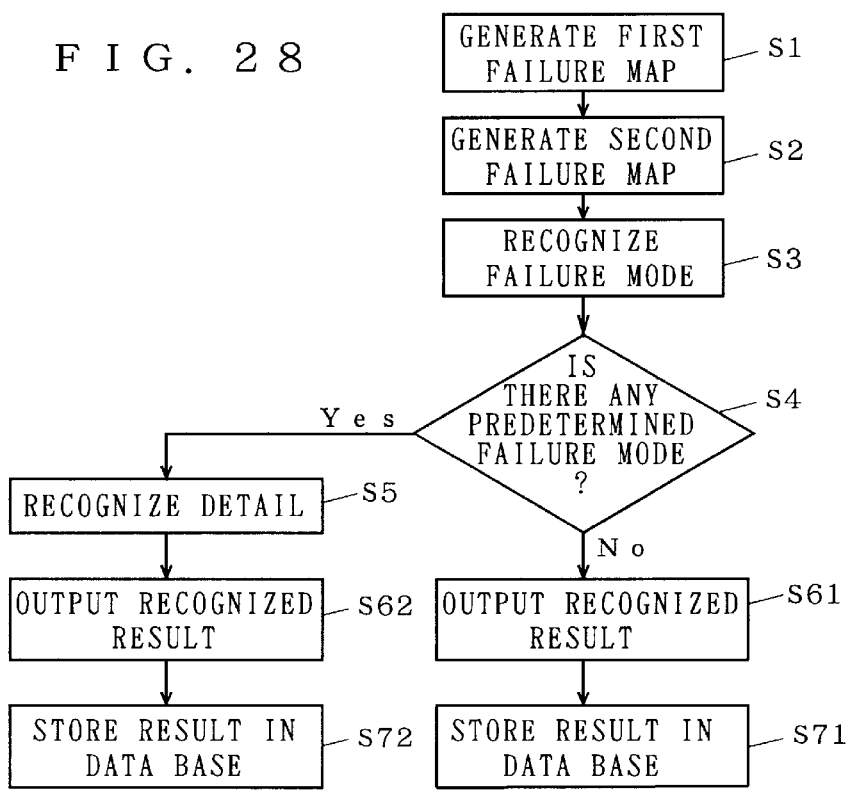
FIG. 28 is a flow chart illustrating the failure analysis method in accordance with the ninth preferred embodiment of the present invention.

FIG. 28 is a flow chart illustrating the failure analysis method according to the ninth preferred embodiment of the present invention. The result recognized at the step S3 is displayed at a step S61, and stored for management in the data base DB1 at the step S71. On the other hand, the result recognized at the step S5 is displayed at a step S62, and stored for management in the data base DB2 at the step S72. The other steps are the same as those of FIG. 2.

Namely, the data base DB2 manages the analysis result obtained by using the extract area; and the data DB1 manages the analysis result obtained by using the second failure map.

The effect of the ninth preferred embodiment is that, since the analysis results obtained by using the extract area and the second failure map, respectively, are separately managed, the processing load in data management can be reduced and the processing speed can be increased.

10. Tenth Preferred Embodiment

Figure 29:
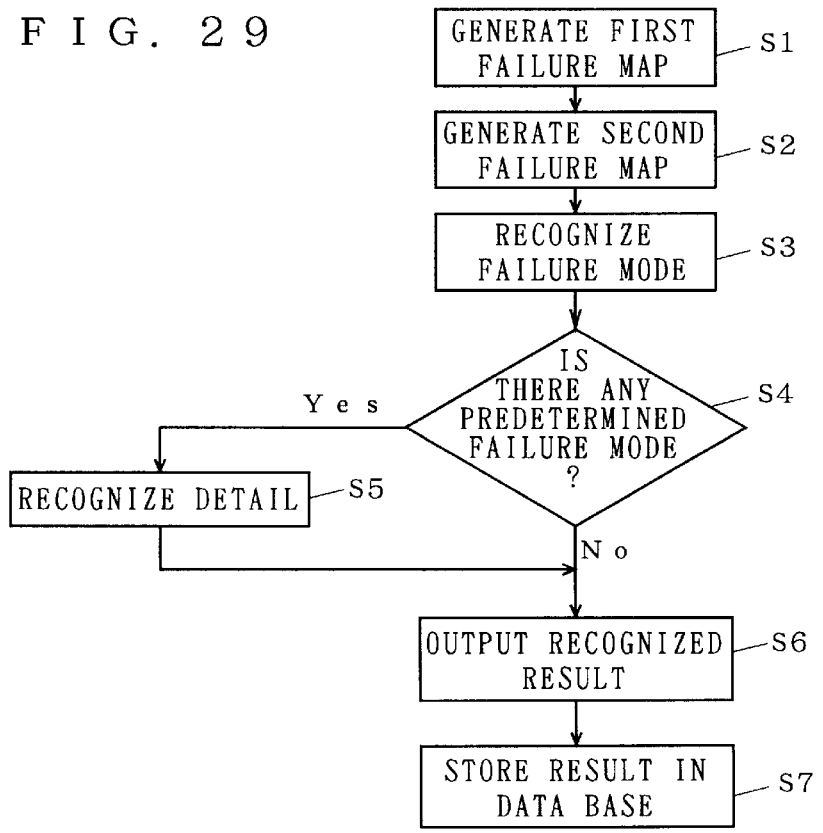
FIG. 29 is a flow chart illustrating the failure analysis method in accordance with a tenth preferred embodiment of the present invention.

FIG. 29 is a flow chart illustrating the failure analysis method according to a tenth preferred embodiment of the present invention. The result recognized at the step S3 or S5 is displayed at a step S6, and stored for management in the data base DB1 at a step S7. The other steps are the same as those of FIG. 2.

Namely, the data base DB1 manages both analysis results obtained by using the extract area and the second failure map, respectively.

The effect of the tenth preferred embodiment is that, since managed by one data base DB1, both analysis results obtained by using the extract area and the second failure map, respectively, can be easily managed. Especially, when the extract area includes a block failure and further the failure mode recognized in this extract area at the step S5 is, for example, a line failure or a bit failure whose cause can be easily analyzed, only one access to the data base DB1 is enough to obtain a significant information for an analysis of the cause of failure.

11. Eleventh Preferred Embodiment

As shown in FIG. 14, in some cases, there is an aggregate FU consisting of the remaining failure components which do not fall under any failure mode. According to an eleventh preferred embodiment, if an operator wants to revise the recognized result (step S8 of FIG. 30), the operator specifies and inputs this aggregate FU, and further inputs the name of the failure mode (step S9). Then, together with the recognized result after the revision, the result recognized at the step S3 or S5 is stored for management in the data base DB1 (step S7).

Figure 30:
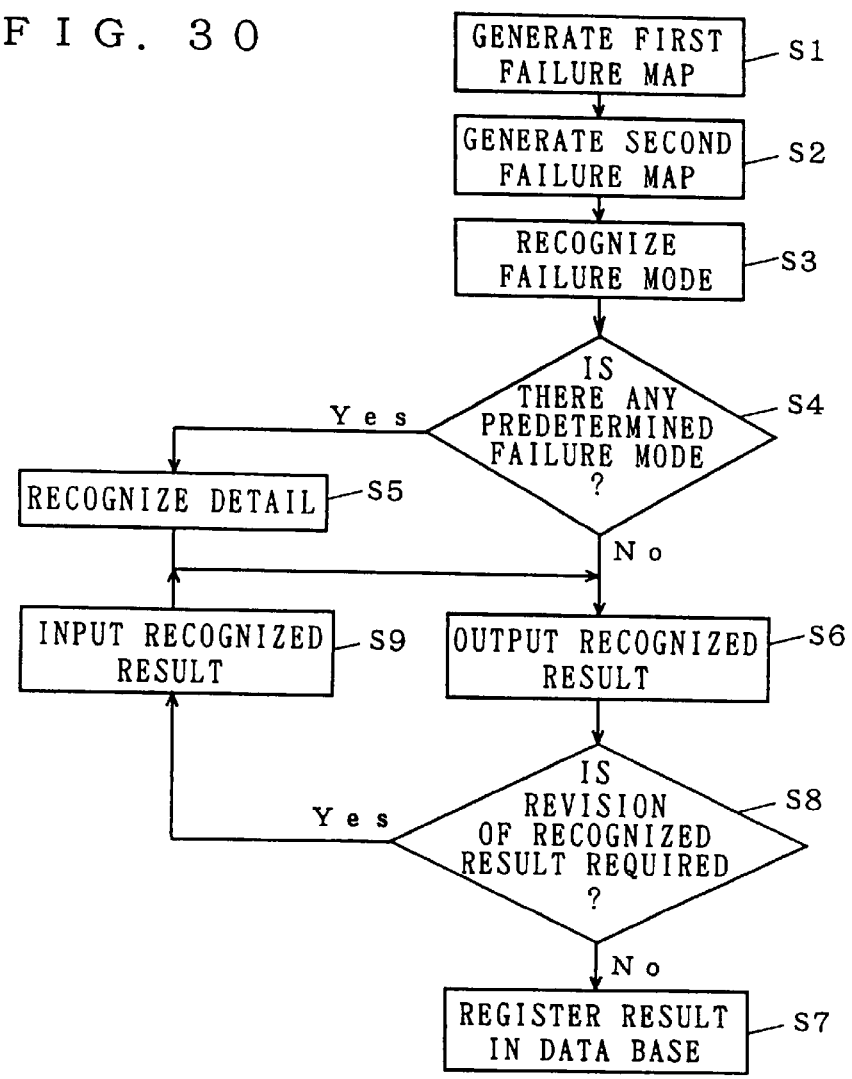
FIG. 30 is a flow chart illustrating the failure analysis method in accordance with an eleventh preferred embodiment of the present invention.
Figure 31:
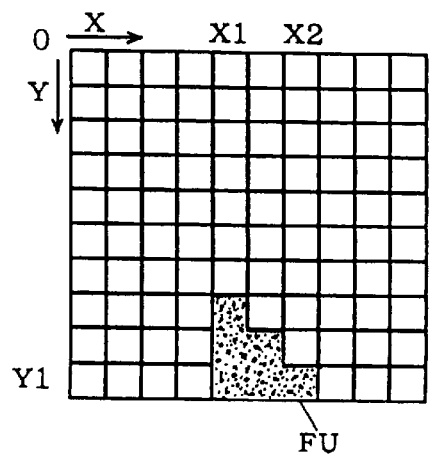
FIG. 31 is a diagram for an explanation of the eleventh preferred embodiment of the present invention.

At the step S5, as shown in FIG. 30, for example, an operator provides coordinates (X1, Y1) and (X2, Y1) from the key board 24 to input a line failure of the aggregate FU in the X direction and further input a "300-bit X-line failure" as a name of the failure mode. FIG. 32 shows an example of the recognized result after the revision.

The effect of the eleventh preferred embodiment is that the analysis result can be accurately grasped by inputting the remaining failure components which do not fall under any failure mode, and its failure mode.

12. Twelfth Preferred Embodiment

While inputted from the key board 24 in the eleventh preferred embodiment, the failure components are specified and inputted from a pointing device such as the mouse 23 in accordance with a twelfth preferred embodiment. For example, the second failure map is displayed at the display device 22 as shown in FIG. 33, and an operator moves a cursor 231 using the mouse to specify and input a failure block. This simplifies the input of the recognized result of the failure components, and increases the input speed.

13. Thirteenth Preferred Embodiment

Since correct coordinates of a defect for the block failure cannot be determined, a defect and a block failure has not been compared before.

In a thirteenth preferred embodiment, coordinates of a defect detected by the defect inspection system 1b at the step S5 are compared with coordinates of a failure bit in the extract area to detect a failure bit existing within the range previously determined on the basis of the coordinates of the defect.

FIG. 34 is a schematic view showing a comparison between the extract area and the defect in accordance with the thirteenth preferred embodiment. As shown in FIG. 34, the bit failure existing within a previously determined distance T from the coordinates of the defect is detected. A bit failure F1 within this range is assumed to be generated by a defect P1, and a bit failure F2 out of this range is assumed not to be generated by the defect P1.

The effect of the thirteenth preferred embodiment is that, even for the block failure, the correct coordinates of a defect to be the cause of failure can be determined by comparing the extract area corresponding to this block failure and the defect. This increases reliability of the comparison between the extract area and the defect.

14. Fourteenth Preferred Embodiment

In a fourteenth preferred embodiment, coordinates of a defect detected by the defect inspection system 1b at the step S5 are compared with coordinates of a failure bit in the extract area to detect a defect existing within a range previously determined on the basis of the coordinates of the failure bit.

Figure 35:
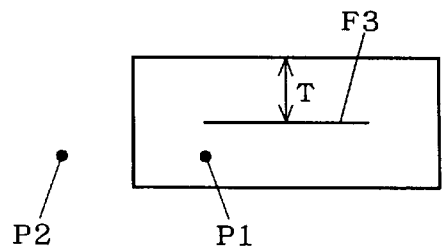
FIG. 35 is a schematic view showing a comparison between an extract area and a defect in accordance with a fourteenth preferred embodiment of the present invention.

FIG. 35 is a schematic view showing a comparison between the extract area and the defect in accordance with the fourteenth preferred embodiment. As shown in FIG. 35, a defect existing within a previously determined distance T from coordinates of a line failure F3, is detected. A defect P1 within this range is assumed to be the cause of the line failure F3, and a defect P2 out of this range is assumed not to be the cause of the line failure F3.

The effect of the fourteenth preferred embodiment is that, even for the block failure, the correct coordinates of a defect to be the cause of failure can be determined by comparing the extract area corresponding to this block failure and the defect. This increases reliability of the comparison between the extract area and the defect.

15. Modification

Figure 36:
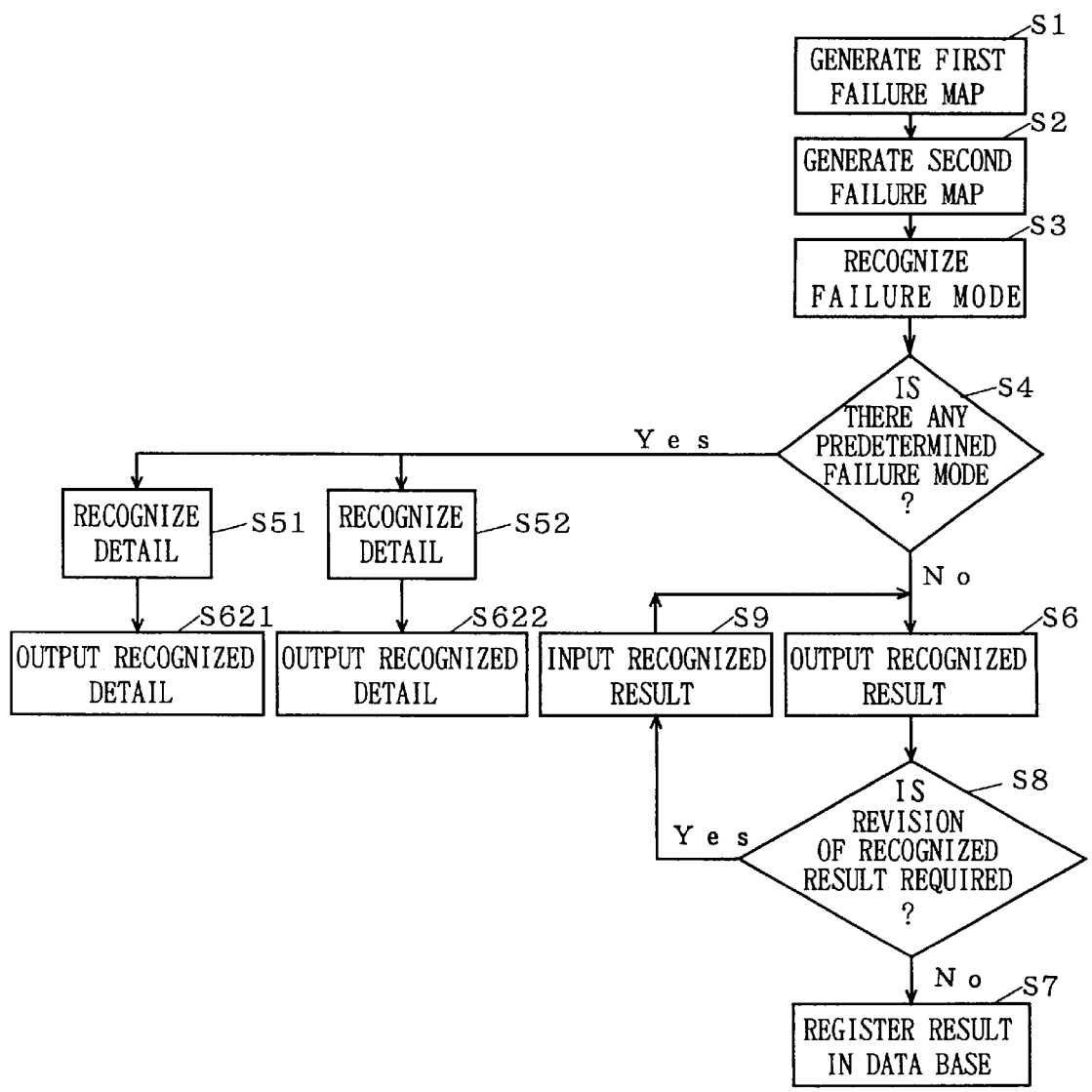
FIG. 36 shows a modification in accordance with the preferred embodiments of the present invention.

It is preferable to combine some of the first through fourteenth preferred embodiments. FIG. 36 shows when some of the first through fourteenth preferred embodiments are combined. In FIG. 36, the detail is recognized through the use of the third failure map shown in either of the fifth through eighth preferred embodiments at a step S51, and the result thereof is outputted at a step S621. At a step S52, the third failure map is not used for a detail recognition. Namely, the detail is recognized with the method described in either of the first through third preferred embodiments, and the result thereof is outputted at the step S622. The other steps are the same as those of the ninth preferred embodiment. An operator previously determines which of the steps S51 or S52 to be used.

While the invention has been described in detail, the foregoing description is in all aspects illustrative and not restrictive. It is understood that numerous other modifications and variations can be devised without departing from the scope of the invention.

We claim:

1. A failure analysis method comprising the steps of:
   (a) generating a first failure map indicating a position of a failure bit in a semiconductor device;
   (b) generating a second failure map indicating a position of a failure block in said first failure map by dividing said first failure map into a plurality of blocks;
   (c) selecting an aggregate consisting of at least one of said blocks from said second failure map; and
   (d) analyzing said semiconductor device by using an area corresponding to said aggregate in said first failure map.

2. The failure analysis method according to claim 1, wherein
a plurality of failure modes are previously set depending on conditions including values obtained on the basis of a size or configuration of said aggregate and the number of failure bits included in said aggregate; and
at least one of said plurality of failure modes is previously set as a select failure mode,
said failure analysis method further comprising the step of:
(e) recognizing said aggregate falling under each of said plurality of failure modes from said second failure map,
wherein said aggregate of said step (c) falls under said select failure mode.

3. The failure analysis method according to claim 2, wherein
in said step (d), said aggregate falling under each of said plurality of failure modes is recognized from said area.

4. The failure analysis method according to claim 3, wherein
said plurality of failure modes includes a failure mode used in said steps (e) and (d).

5. The failure analysis method according to claim 4, wherein
in said step (d), said plurality of failure modes are recognized in a predetermined order of priority.

6. The failure analysis method according to claim 4, wherein
a failure mode used in said step (d) is obtained by deleting a predetermined failure mode from a plurality of failure modes used in said step (e).

7. The failure analysis method according to claim 1, wherein
said step (d) further comprises the step of dividing said area into a plurality of blocks and generating a third failure map indicating a gradient value obtained on the basis of the number of failure bits included in each of said plurality of blocks.

8. The failure analysis method according to claim 7, wherein
in said step (d), each block in said third failure map is displayed in, for example, pattern or color depending on said gradient value of said block.

9. The failure analysis method according to claim 7, wherein
there are two kinds of gradient values in said step (d).

10. The failure analysis method according to claim 9, wherein
a plurality of failure modes are previously set depending on conditions including values obtained on the basis of a size or configuration of said aggregate and the number of failure bits included in said aggregate; and
at least one of said plurality of failure modes is previously set as a select failure mode,
said failure analysis method further comprising the step of:
(e) recognizing said aggregate falling under each of said plurality of failure modes from said second failure map,
wherein said aggregate in said step (c) falls under said select failure mode; and
in said step (d), said aggregate falling under each of said plurality of failure modes is recognized from said third failure map.

11. The failure analysis method according to claim 2, wherein
in said step (d), a failure mode of said aggregate corresponding to said area is managed.

12. The failure analysis method according to claim 3, further comprising the steps of:
(f) managing a result recognized at said step (e) in a first data base; and
(g) managing a result recognized at said step (d) in a second data base.

13. The failure analysis method according to claim 3, further comprising the step of:
(h) managing both results recognized at said steps (e) and (d) in the same data base.

14. The failure analysis method according to claim 2, further comprising the steps of:
(f) managing a result recognized at said step (e) in a data base; and
(g) managing said recognized result of said failure block inputted from outside in said data base.

15. The failure analysis method according to claim 14, wherein
in said step (g), said second failure map is displayed at a display device, and said recognized result is inputted by a pointing device.

16. The failure analysis method according to claim 1, wherein
in said step (d), coordinates of a defect detected by a defect inspection system and coordinates of a failure bit in said area are compared to detect a failure bit existing within a range previously determined on the basis of said coordinates of said defect.

17. The failure analysis method according to claim 1, wherein
in said step (d), coordinates of a defect detected by a defect inspection system and coordinates of a failure bit in said area are compared to detect a defect existing within a range previously determined on the basis of coordinates of said failure bit.

18. A failure analysis device comprising:
a first failure map generating portion for generating a first failure map indicating a position of a failure bit in a semiconductor device;
a second failure map generating portion for generating a second failure map indicating a position of a failure block in said first failure map by dividing said first failure map into a plurality of blocks;
a selecting portion for selecting an aggregate consisting of at least one block from said second failure map; and
an analysis portion for analyzing a semiconductor device by using an area corresponding to said aggregate in said first failure map.

* * * * *